United States Patent
Kodama et al.

(10) Patent No.: US 7,488,532 B2
(45) Date of Patent: Feb. 10, 2009

(54) ADHESIVE RESIN COMPOSITION AND ADHESIVE AGENT IN FILM FORM, AND SEMICONDUCTOR DEVICE USING THE SAME

(75) Inventors: Youichi Kodama, Sodegaura (JP); Hiroshi Maruyama, Yokohama (JP); Isao Naruse, Isehara (JP)

(73) Assignee: Mitsui Chemicals, Inc., Tokyo (JP)

( * ) Notice: Subject to any disclaimer, the term of this patent is extended or adjusted under 35 U.S.C. 154(b) by 488 days.

(21) Appl. No.: 10/551,957

(22) PCT Filed: Apr. 13, 2004

(86) PCT No.: PCT/JP2004/005266

§ 371 (c)(1),
(2), (4) Date: Oct. 6, 2005

(87) PCT Pub. No.: WO2004/101701

PCT Pub. Date: Nov. 25, 2004

(65) Prior Publication Data

US 2006/0281872 A1    Dec. 14, 2006

(30) Foreign Application Priority Data

May 14, 2003    (JP) ............... 2003-136252

(51) Int. Cl.
*C09J 163/00* (2006.01)
*C09J 179/08* (2006.01)
*C08G 59/02* (2006.01)
*H01L 21/00* (2006.01)

(52) U.S. Cl. ............. 428/355 R; 257/783; 257/E23.09; 428/355 EP; 428/355 N; 428/901; 438/106; 438/118

(58) Field of Classification Search ............... 525/423, 525/436; 257/783, E23.029; 428/355 R, 428/355 EP, 355 N, 901; 438/106, 118
See application file for complete search history.

(56) References Cited

U.S. PATENT DOCUMENTS

| | | | |
|---|---|---|---|
| 5,406,124 A | | 4/1995 | Morita et al. |
| 6,693,162 B2 * | | 2/2004 | Tsuji et al. .................. 528/170 |
| 2003/0045669 A1 | | 3/2003 | Tsuji et al. |

FOREIGN PATENT DOCUMENTS

| | | |
|---|---|---|
| JP | 05-331444 A | 12/1993 |
| JP | 6-200218 A | 7/1994 |
| JP | 2996857 B2 | 9/1995 |
| JP | 9-59589 A | 3/1997 |
| JP | 11-92744 A | 4/1999 |
| JP | 2001-311053 A | 11/2001 |
| JP | 2001-348556 A | 12/2001 |
| JP | 2002-069420 A | 3/2002 |
| JP | 2003-027014 A | 1/2003 |
| JP | 2003-027034 A | 1/2003 |

* cited by examiner

*Primary Examiner*—Ana L Woodward
(74) *Attorney, Agent, or Firm*—Buchanan Ingersoll & Rooney PC

(57) ABSTRACT

The present invention is to provide an adhesive resin composition for use in preparing an adhesive in the form of a film which is excellent in the adhesiveness at a low temperature and in the heat resistance, an adhesive in the form of a film comprising the adhesive resin composition, and a semiconductor device using the adhesive in the form of a film.

9 Claims, No Drawings

ADHESIVE RESIN COMPOSITION AND ADHESIVE AGENT IN FILM FORM, AND SEMICONDUCTOR DEVICE USING THE SAME

TECHNICAL FIELD

The present invention relates to an adhesive resin composition which is used for an adhesive in the form of a film as a die bonding material for use in adhesion between semiconductor elements such as IC, LSI or the like, or adhesion of such semiconductor elements to supporting members, an adhesive in the form of a film comprising the adhesive resin composition, and a semiconductor device using the adhesive in the form of a film.

BACKGROUND ART

In recent years, an adhesive in the form of a film has been used as a die bonding material in use for adhesion between semiconductor elements such as IC or LSI, or adhesion of semiconductor elements to supporting members, instead of an adhesive in the form of a paste that has been used from the past. In particular, in a high-density surface-mounting semiconductor device having a small mounting area such as a chip-sized package, a stack package, a system in package or the like, an adhesive in the form of a film which is excellent in the thickness accuracy or in the projection controllability as compared to an adhesive film in the form of a paste has been widely applied.

With this recent high-density mounting trend, thinning of a semiconductor element has been advanced. An adhesive in the form of a film is attached to a wafer having a thickness of not more than 100 μm at a state that a surface protecting tape to be used when grinding finely is attached, in order to prevent breakage of the wafer.

When the adhesion temperature in the adhesion process is high, a surface protecting tape having a low heat resistance is thermally deformed, causing the wafer to bend. So, a big defect occurs when the wafer is carried back into a cartridge or the wafer is conveyed. For that reason, an adhesive in the form of a film having a property capable of adhering at a much lower temperature (hereinafter referred to as adhesiveness at a low temperature) has been in demand.

As for an adhesive in the form of a film having excellent adhesiveness at a low temperature which can be applied to this usage, an adhesive comprising a polyimide siloxane having a repeating structural unit represented by the following general formula (3) has been known (refer to JP1993-331444A, U.S. Pat. No. 2,996,857, JP1997-59589A, JP1999-92744A and the like),

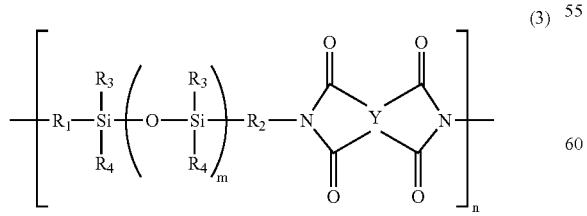

wherein, in the formula (3), Y represents a quadrivalent organic group; $R_1$ and $R_2$ represent divalent hydrocarbon groups; $R_3$ and $R_4$ represent monovalent hydrocarbon groups; $R_1$ and $R_2$, and $R_3$ and $R_4$ may each be the same or different; m is an integer of not less than 2; and n is an integer of not less than 1.

It is known that the aforementioned polyimide siloxane can be usually prepared by subjecting a diaminopolysiloxane which is used at least as a diamine component represented by the following general formula (4), and a tetracarboxylic acid dianhydride which is used as an acid dianhydride component represented by the following general formula (5) to an imidization reaction by heating,

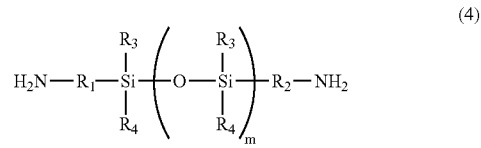

wherein, in the formula (4), $R_1$ and $R_2$ represent divalent hydrocarbon groups; $R_3$ and $R_4$ represent monovalent hydrocarbon groups; $R_1$ and $R_2$, and $R_3$ and $R_4$ may each be the same or different; and m is an integer of not less than 2,

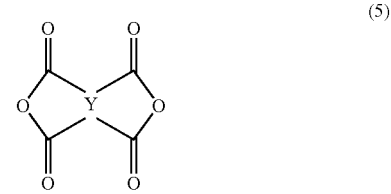

wherein, in the formula (5), Y represents a quadrivalent organic group.

The diaminopolysiloxane represented by the above formula (4) is usually obtained by reacting a diaminosiloxane compound represented by the following general formula (6), with a cyclic siloxane represented by the following general formula (7) in the presence of an alkali catalyst,

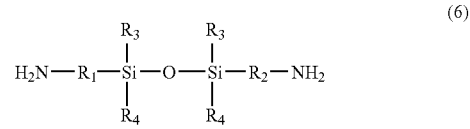

wherein, in the formula (6), $R_1$ and $R_2$ represent divalent hydrocarbon groups; $R_3$ and $R_4$ represent monovalent hydrocarbon groups; and $R_1$ and $R_2$, and $R_3$ and $R_4$ may each be the same or different,

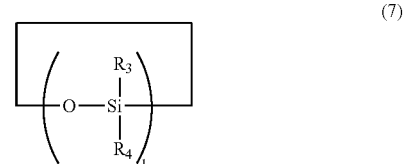

wherein, in the formula (7), $R_3$ and $R_4$ represent monovalent hydrocarbon groups and may each be the same or different; and l is an integer of not less than 3. Since this reaction is an equilibrium reaction, the cyclic siloxane represented by the general formula (7) necessarily remains in the diaminopolysiloxane represented by the general formula (4) as an impurity.

This remained cyclic siloxane is non-reactive, but its boiling point depends on the molecular weight and the cyclic siloxane having a low molecular weight volatilizes at a relatively low temperature. As a result, the present inventors have found that, when an adhesive in the form of a film comprising polyimide siloxane having a diaminopolysiloxane as a raw material which was not pre-treated for the reduction of the cyclic siloxane was used in the production of a semiconductor device, the cyclic siloxane volatilized by heating in the process, causing defects in some cases.

For example, one of the production processes is a wire bonding process, but in that process, a semiconductor device in the production is exposed to a temperature of from about 150 to 200° C. for several minutes to 1 hour or so. At that time, when the cyclic siloxane having a low boiling point (boiling point of a cyclic trimer: 134° C. and that of a cyclic tetramer: 175° C.) volatilizes, a wire bonding pad part is contaminated, causing some problems. That is, the adhesive strength in the wire bonding is deteriorated or the wire bonding miss occurs.

On the other hand, while the environmental problem has been recently getting serious, the lead free soldering used for adhesion of a semiconductor device to a substrate has been continuously progressed. As a reliable candidate of the lead free soldering, Sn—Ag—Cu type soldering can be cited, which has a melting point of about 220° C., about 40° C. higher than a melting point of the current Sn—Pb type soldering of about 180° C. So, it is said that the surface temperature of a semiconductor device at the time of mounting using lead free soldering reaches 250 to 260° C. For that reason, an adhesive in the form of a film having excellent heat resistance has been in demand for maintaining sufficient adhesive strength even at 260° C.

In order to solve the above problems, an object of the present invention is to provide an adhesive resin composition which can be used for an adhesive in the form of a film exhibiting superior adhesiveness at a low temperature and heat resistance, an adhesive in the form of a film comprising the adhesive resin composition, and a semiconductor device using the adhesive in the form of a film.

DISCLOSURE OF THE INVENTION

The first invention is an adhesive resin composition comprising a thermoplastic polyimide obtained by reacting a diamine component comprising a diamine represented by the following general formula (1) with a tetracarboxylic acid dianhydride, and a thermosetting resin contained in the ratio of from 1 to 200 weight parts, based on 100 weight parts of the thermoplastic polyimide,

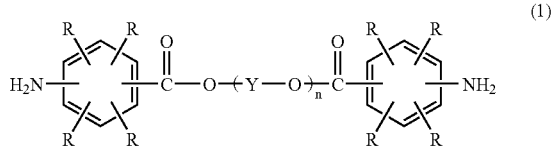

wherein, in the formula (1), Rs are each independently an atom or a group selected from a group comprising a hydrogen atom, a halogen atom and a hydrocarbon group; n is a positive number of 1 to 50 on an average; Y represents an unsubstituted or substituted divalent organic group having 2 to 10 carbons; and Ys may be the same or different when n is not less than 2.

The diamine represented by the above general formula (1) is preferably a diamine represented by the following general formula (2) as it can be relatively easily synthesized,

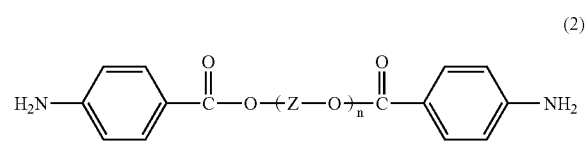

wherein, in the formula (2), n is a positive number of 1 to 50 on an average; Z represents an alkylene group having 2 to 10 carbons; and Zs may be the same or different when n is not less than 2.

The diamine represented by the above general formula (1) is preferably contained in the amount of not less than 20 mole % in the total diamine components from the viewpoint of the adhesiveness at a low temperature.

The second invention is an adhesive in the form of a film comprising the above adhesive resin composition.

The third invention is a semiconductor device with semiconductor elements attached using the above adhesive in the form of a film.

BEST MODE FOR CARRYING OUT THE INVENTION

The adhesive resin composition of the present invention comprises a thermoplastic polyimide obtained by reacting a diamine component comprising a diamine represented by the following formula (1) with a tetracarboxylic acid dianhydride, and a thermosetting resin,

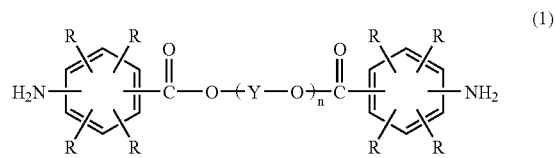

wherein, in the formula (1), Rs are each independently an atom or a group selected from a group comprising a hydrogen atom, a halogen atom and a hydrocarbon group; n is a positive number of 1 to 50 on an average; Y represents an unsubstituted or substituted divalent organic group having 2 to 10 carbons; and Ys may be the same or different when n is not less than 2.

The diamine represented by the above formula (1) is a diamine having an o-aminobenzoate group, an m-aminobenzoate group, or a p-aminobenzoate group at both ends. Of these, a diamine having a p-aminobenzoate group at both ends represented by the above formula (2) is preferable. In the formula (1), n is a positive number of 1 to 50 on an average and preferably a positive number of 3 to 25 on an average. Y is preferably an alkylene group having 2 to 10 carbons and further preferably an alkylene group having 2 to 5 carbons. Ys may be the same or different when n is not less than 2.

Examples of a halogen atom in R include fluorine, chlorine and the like, while examples of a hydrocarbon group include a methyl group, an ethyl group, a propyl group and the like. As an unsubstituted or substituted divalent organic group having 2 to 10 carbons in Y, there can be exemplified, an alkylene group, an alkylether group and the like. As an alkylene group having 2 to 10 carbons, there can be exemplified, ethylene, trimethylene, tetramethylene, pentamethylene and the like, of which tetramethylene is preferable.

Concrete examples of the diamine represented by the formula (1) include, though not restricted to, polytetramethyleneoxide-di-o-aminobenzoate, polytetramethyleneoxide-di-m-aminobenzoate, polytetramethyleneoxide-di-p-aminobenzoate, polytrimethyleneoxide-di-o-aminobenzoate, polytrimethyleneoxide-di-m-aminobenzoate, polytrimethyleneoxide-di-p-aminobenzoate and the like. Of these, polytetramethyleneoxide-di-p-aminobenzoate represented by the general formula (2) is preferable.

The amount of the diamine contained in the total diamine components is preferably not less than 20 mole %, and more preferably not less than 40 mole %. The upper limit is preferably not more than 80 mole %. When an adhesive is prepared using a diamine within this range, the adhesion temperature can be suppressed.

Furthermore, examples of a diamine which can be used along with the diamine represented by the formula (1) include, though not restricted to, 3,3'-diaminobenzophenone, 4,4'-diaminobenzophenone, 3,3'-diaminodiphenylether, 4,4'-diaminodiphenylether, 4,4'-bis(3-aminophenoxy)biphenyl, 4,4'-bis(4-aminophenoxy)biphenyl, 1,3-bis(3-aminophenoxy)benzene, 1,4-bis(4-aminophenoxy)benzene, bis(3-(3-aminophenoxy)phenyl)ether, bis(4-(4-aminophenoxy)phenyl)ether, 1,3-bis(3-(3-aminophenoxy)phenoxy)benzene, 1,4-bis(4-(4-aminophenoxy)phenoxy)benzene, bis(3-(3-(3-aminophenoxy)phenoxy)phenyl)ether, bis(4-(4-(4-aminophenoxy)phenoxy)phenyl)ether, 1,3-bis(3-(3-aminophenoxy)phenoxy)phenoxy)benzene, 1,4-bis(4-(4-aminophenoxy)phenoxy)phenoxy)benzene, 2,2-bis[4-(3-aminophenoxy)phenyl]propane, 2,2-bis[4-(4-aminophenoxy)phenyl]propane, 2,2-bis[4-(3-aminophenoxy)phenyl]-1,1,1,3,3,3-hexafluoropropane, 2,2-bis[4-(4-aminophenoxy)phenyl]-1,1,1,3,3,3-hexafluoropropane and the like. Of these, 4,4'-bis(3-aminophenoxy)biphenyl, 1,3-bis(3-aminophenoxy)benzene, and 1,3-bis(3-(3-aminophenoxy)phenoxy)benzene are preferable. These can be used singly or in combination of two or more kinds.

The tetracarboxylic acid dianhydride which can be used in the present invention is not restricted, and conventionally known tetracarboxylic acid dianhydrides can be used. A polyimide having various glass transition temperatures can be obtained according to the types of the tetracarboxylic acid dianhydride in use.

Concrete examples of the tetracarboxylic acid dianhydride used in the present invention include pyromellitic acid dianhydride, 3,3',4,4'-benzophenone tetracarboxylic acid dianhydride, 3,3',4,4'-biphenyl tetracarboxylic acid dianhydride, oxy4,4'-diphthalic acid dianhydride, ethylene glycol bistrimellitic acid dianhydride, 2,2-bis(4-(3,4-dicarboxyphenoxy)phenyl)propane dianhydride and the like. These can be used singly or in combination of two or more kinds. Of these, oxy-4,4'-diphthalic acid dianhydride and ethylene glycol bistrimellitic acid dianhydride are preferable.

As a method for preparing polyimides, any methods capable of preparing polyimides including known methods can be applied. Of the methods, the reaction is preferably carried out in an organic solvent. As a solvent which can be used in this reaction, there can be exemplified N,N-dimethylformamide, N,N-dimethylacetamide, N-methyl-2-pyrrolidone, 1,2-dimethoxyethane, tetrahydrofuran, 1,3-dioxane, 1,4-dioxane, dimethylsulfoxide, benzene, toluene, xylene, mesitylene, phenol, cresol and the like. These can be used singly or in combination of two or more kinds.

Furthermore, the concentration of the reaction raw material in a solvent in this reaction is usually from 2 to 50 weight %, preferably from 5 to 40 weight %, while the reaction molar ratio of the tetracarboxylic acid dianhydride to the diamine component is preferably in the range of 0.8 to 1.2. Within this range, the heat resistance is preferably not deteriorated.

The reaction temperature for the synthesis of a polyamide acid, a precursor of polyimide, is usually not more than 60° C., and preferably not less than 10° C. and not more than 50° C. The reaction pressure is not particularly restricted and the reaction can be sufficiently carried out in an atmospheric pressure. Furthermore, the reaction time is different depending on the types of a reaction raw material, the types of a solvent and the reaction temperature, but 0.5 to 24 hours are usually sufficient. The polyimide according to the present invention is imidized either by heating the polyamide acid obtained under the above conditions at a temperature of from 100 to 400° C. or chemically imidized by using an imidizing agent such as an acetic anhydride and the like, whereby a polyimide having a repeating structural unit corresponding to the polyamide acid is obtained.

Furthermore, by carrying out the reaction at 130 to 250° C., generation of a polyamide acid and an imidization reaction by heating are progressed at the same time, whereby the polyimide according to the present invention can be obtained. Namely, the diamine component and the tetracarboxylic acid dianhydride are suspended or dissolved in an organic solvent, and reacted by heating at 130 to 250° C. for carrying out generation of a polyamide acid and a dehydration imidization at the same time, whereby the polyimide according to the present invention can be obtained.

The molecular weight of the polyimide of the present invention is not particularly restricted and any molecular weight can be used according to the application or processing methods. The polyimide of the present invention can have the target molecular weight by regulating the ratio of the diamine component to the tetracarboxylic acid dianhydride in use. For example, the polyimide is dissolved in N-methyl-2-pyrrolidone to have a concentration of 0.5 g/dl and then the logarithmic viscosity (molecular weight index) measured at 35° C. can be any values in the range of 0.1 to 3.0 dl/g.

In the present invention, an expression of polyimide includes a resin in which a polyamide acid, a precursor of polyimide, in addition to the 100% imidized polyimide, is partly present together.

Meanwhile, the polyimide solution obtained in the above reaction may be used as it is, but the aforementioned polyimide solution may be fed into a poor solvent for reprecipitating and depositing polyimide.

The adhesive resin composition of the present invention is obtained by adding a thermosetting resin and a filler as needed in the aforementioned polyimide.

The thermosetting resin is not particularly restricted as far as it forms a three dimensional network structure by heating. However, from the viewpoint of excellent hardenability, a resin comprising an epoxy compound containing at least two epoxy groups in a molecule and a curing agent is preferable.

Examples of the epoxy compound include glycidyl ether of bisphenol A, bisphenol S and bisphenol F, a phenol novolac type epoxy resin, a biphenyl type epoxy compound and the like.

The combination amount of the epoxy compound is from 1 to 200 weight parts and preferably from 1 to 100 weight parts, based on 100 weight parts of the polyimide. Within this range, the heat resistance is maintained so that film-forming performance is not deteriorated in any case.

Meanwhile, as a curing agent, there can be exemplified an imidazole type curing agent, a phenol type curing agent, an amine type curing agent, an acid anhydride type curing agent and the like. From the viewpoint of the self-life stability of the resin composition, a curing agent may preferably have thermal latency and a long pot life.

The combination amount of the curing agent is preferably in the range of 0 to 20 weight parts, based on 100 weight parts of the epoxy compound. Within this range, gelation hardly takes place in the state of a resin solution so that the self-life stability of the resin solution is superior.

A filler is not particularly restricted as far as it is known. Concrete examples of an organic filler include particle-type fillers in which a high molecular polymer is obtained or which is crosslinked until it is insoluble in a resin-dissolved solvent such as an epoxy resin, a melamine resin, a urea resin, a phenol resin and the like. Concrete examples of an inorganic filler include particles of metal oxides such as alumina, antimony oxide, ferrite and the like; or silicates such as talc, silica, mica, kaolin, zeolite and the like; and particles such as barium sulfate, calcium carbonate and the like. The aforementioned fillers can be used singly or in combination of two or more kinds.

The combination amount of the above filler is from 0 to 5000 weight parts and preferably from 0 to 3000 weight parts, based on 100 weight parts of the polyimide. Within this range, a filler hardly sinks in the state of a resin solution so that the self-life stability of the resin solution is superior. On the other hand, when the filler is too much contained in an adhesive in the form of a film, the adhesiveness is deteriorated in some cases.

Furthermore, a coupling agent may be added as needed. The coupling agent is not particularly restricted as far as it does not damage the object of the present invention, but a curing agent exhibiting good solubility in the resin-dissolved solvent is preferable. Concrete examples thereof include a silane type coupling agent, a titanium type coupling agent and the like.

The combination amount of the coupling agent is from 0 to 50 weight parts, and preferably from 0 to 30 weight parts, based on 100 weight parts of the polyimide. Within this range, the heat resistance is not deteriorated in any case.

The adhesive resin composition of the present invention preferably has a glass transition temperature or a softening temperature of from 30 to 200° C. The adhesiveness at a low temperature that is a characteristic of the present invention can be exhibited by having a glass transition temperature or a softening temperature in this range. When the glass transition temperature is too lowered, less than 30° C., the adhesive in the form of a film prepared by using the adhesive resin composition having such Tg becomes very tacky so that not only the workability is deteriorated, but also the self-life stability is worsened in some cases. Meanwhile, when it is high, exceeding 200° C., in the production of a semiconductor device using an adhesive in the form of a film comprising the adhesive resin composition, the mounting temperature becomes high; therefore, such a temperature is not preferable in some cases.

Incidentally, the glass transition temperature of the adhesive in the form of a film is the same as that of the adhesive resin composition.

A method for preparing an adhesive in the form of a film using the adhesive resin composition of the present invention is not particularly restricted. For example, a method comprising coating one side or both sides of a resin film or a heat resistant film with a resin solution in which the adhesive resin composition is dissolved in an organic solvent, and then heating for volatilizing the solvent to form a film can be cited.

The organic solvent used in the production of the adhesive in the form of a film of the present invention is not restricted as far as it can uniformly dissolve, mix or disperse a material. Examples thereof include N,N-dimethylformamide, N,N-dimethylacetamide, N-methyl-2-pyrrolidone, 1,2-dimethoxyethane, tetrahydrofuran, 1,3-dioxane, 1,4-dioxane, dimethylsulfoxide, benzene, toluene, xylene, mesitylene, phenol, cresol and the like. These can be used singly or in combination of two or more kinds.

Here, a resin film used in the production of an adhesive in the form of a film may be any substance as far as it is insoluble in an organic solvent used for dissolving the above adhesive resin composition and it is not softened or thermally degraded in the course of forming a film by heating for volatilizing the solvent. A resin film may be preferably excellent in the peeling property from an adhesive in the form of a film. Examples thereof include a polyethyleneterephthalate film which is silicon-treated or Teflon (registered trademark)-treated on its surface and the like.

As a heat resistant film, there can be exemplified, for example, a film comprising a heat resistant resin of polyimide, polyphenylene sulfide, polyether, polyether ketone, polyetherether ketone; a composite heat resistant film such as epoxy resin-glass cloth, epoxy resin-polyimide-glass cloth and the like. Polyimide can be preferably cited.

The thickness of the adhesive in the form of a film is preferably not less than 1 μm and not more than 50 μm, and more preferably not less than 5 μm and not more than 40 μm. When it is too thin, it is difficult to surely attach an adhesive in the form of a film to a supporting member while it is used in a process of manufacturing a semiconductor device in some cases. When it is thick, exceeding 50 μm, the covering capability for the supporting member or the like is not improved. Accordingly, this range is sufficient.

The adhesive in the form of a film of the present invention can be properly used as a so-called die-attach film or the like in order to attach a semiconductor element to a supporting member in a semiconductor device. A method for manufacturing a semiconductor device comprising the adhesive in the form of a film of the present invention is not particularly restricted, but the following methods can be cited.

An adhesive in the form of a film is attached to a back surface of a heated semiconductor wafer using a roll and the film at the periphery of the wafer is cut to obtain a wafer with an adhesive in the form of a film attached thereto. This wafer is diced in an arbitrary size to obtain a semiconductor element with an adhesive in the form of a film attached thereto. Subsequently, the thus-obtained semiconductor element is heat-pressed to a supporting member, which is then subjected to a wire boding process and a molding process. Through such processes, a semiconductor device is obtained.

As the supporting member, there can be exemplified, for example, a rigid substrate, a flexible substrate, a lead frame and the like. When chips are laminated in several layers, examples thereof include chips, spacers and the like.

EXAMPLES

The present invention is now more specifically illustrated below with reference to Examples. However, the present invention is not restricted to these Examples.

Synthesis Example 1

A 300-ml, 5-necked separable flask was provided with a stirrer, a nitrogen inlet tube, a thermometer, and a Dean Stark tube charged with mesitylene. Therein were weighed 17.00 g of 4,4'-bis(3-aminophenoxy)biphenyl, 40.14 g of polytetramethyleneoxide-di-p-aminobenzoate (a product of Ihara Chemical Industry Co., Ltd., product name: ELASMER-1000, average molecular weight: 1,305), 86.3 g of N-methyl-2-pyrrolidone, and 37.0 g of mesitylene. The mixture was heated at 50° C. under a nitrogen atmosphere and dissolved, and 25.05 g of oxy-4,4'-diphthalic acid dianhydride was added thereto little by little. Then, the nitrogen inlet tube was inserted into the solution (for a bubbling state), while the temperature in the system was heated to from 170 to 180° C. for removing water by azeotropy and maintained for 14 hours. After cooling, 61.6 g of N-methyl-2-pyrrolidone and 26.4 g of mesitylene were added for diluting and a polyimide (P-1) solution was obtained. The polyimide was dissolved in N-methyl-2-pyrrolidone to have a concentration of 0.5 g/dl and then the solution was measured using an Ubbelodhe viscometer at 35° C. As a result, the logarithmic viscosity of the polyimide (P-1) was 0.45 dl/g.

Synthesis Example 2

A 300-ml, 5-necked separable flask was provided with a stirrer, a nitrogen inlet tube, a thermometer, and a Dean Stark tube charged with mesitylene. Therein were weighed 8.00 g of 1,3-bis(3-aminophenoxy)benzene, 53.58 g of polytetramethyleneoxide-di-p-aminobenzoate (a product of Ihara Chemical Industry Co., Ltd., product name: ELASMER-1000, average molecular weight: 1,305), 88.1 g of N-methyl-2-pyrrolidone, and 37.7 g of mesitylene. The mixture was heated at 50° C. under a nitrogen atmosphere and dissolved, and 22.29 g of oxy-4,4'-diphthalic acid dianhydride was added thereto little by little. Then, the nitrogen inlet tube was inserted into the solution (for a bubbling state), while the temperature in the system was heated to from 170 to 180° C. for removing water by azeotropy and maintained for 14 hours. After cooling, 62.5 g of N-methyl-2-pyrrolidone and 26.8 g of mesitylene were added for diluting and a polyimide (P-2) solution was obtained. The polyimide was dissolved in N-methyl-2-pyrrolidone to have a concentration of 0.5 g/dl and then the solution was measured using an Ubbelodhe viscometer at 35° C. As a result, the logarithmic viscosity of the polyimide (P-2) was 0.41 dl/g.

Synthesis Example 3

A 300-ml, 5-necked separable flask was provided with a stirrer, a nitrogen inlet tube, a thermometer, and a Dean Stark tube charged with mesitylene. Therein were weighed 14.00 g of 1,3-bis(3-(3-aminophenoxy)phenoxy)benzene, 46.59 g of polytetramethyleneoxide-di-p-aminobenzoate (a product of Ihara Chemical Industry Co., Ltd., product name: ELASMER-1000, average molecular weight: 1,305), 85.8 g of N-methyl-2-pyrrolidone, and 36.8 g of mesitylene. The mixture was heated at 50° C. under a nitrogen atmosphere and dissolved, and 21.14 g of oxy-4,4'-diphthalic acid dianhydride was added thereto little by little. Then, the nitrogen inlet tube was inserted into the solution (for a bubbling state), while the temperature in the system was heated to from 170 to 180° C. for removing water by azeotropy and maintained for 14 hours. After cooling, 61.3 g of N-methyl-2-pyrrolidone and 26.3 g of mesitylene were added for diluting and a polyimide (P-3) solution was obtained. The polyimide was dissolved in N-methyl-2-pyrrolidone to have a concentration of 0.5 g/dl and then the solution was measured using an Ubbelodhe viscometer at 35° C. As a result, the logarithmic viscosity of the polyimide (P-3) was 0.41 dl/g.

Synthesis Example 4

A 300-ml, 5-necked separable flask was provided with a stirrer, a nitrogen inlet tube, a thermometer, and a Dean Stark tube charged with mesitylene. Therein were weighed 10.00 g of 1,3-bis(3-aminophenoxy)benzene, 47.21 g of diaminopolysiloxane (a product of Dow Corning Toray Silicone Co., Ltd., BY16-853U, average molecular weight: 920), 89.3 g of N-methyl-2-pyrrolidone and 38.3 g of mesitylene. The mixture was heated at 50° C. under a nitrogen atmosphere and dissolved, and 27.86 g of oxy-4,4'-diphthalic acid dianhydride was added thereto little by little. Then, the nitrogen inlet tube was inserted into the solution (for a bubbling state), while the temperature in the system was heated to from 170 to 180° C. for removing water by azeotropy and maintained for 14 hours. After cooling, 49.6 g of N-methyl-2-pyrrolidone and 21.3 g of mesitylene were added for diluting and a polyimide (P-4) solution was obtained. The polyimide was dissolved in N-methyl-2-pyrrolidone to have a concentration of 0.5 g/dl and then the solution was measured using an Ubbelodhe viscometer at 35° C. As a result, the logarithmic viscosity of the polyimide (P-4) was 0.24 dl/g.

Example 1

The polyimide (P-1) solution obtained in Synthesis Example 1 was mixed with 20 weight parts of an epoxy compound (a product of Mitsui Chemicals, Inc., VG3101), 1 weight part of an imidazole type curing agent (a product of Shikoku Corp., 2MAOK-PW), and 40 weight parts of a silica type filler (a product of Tatsumori Ltd., 1-FX), based on 100 weight parts of the solid content. The resulting mixture was fully mixed using a stirrer to obtain an adhesive resin composition. The obtained resin composition was cast on a surface-treated PET film (a product of Teijin Dupont Films Ltd., A31, thickness: 50 μm) and heated at 90° C. for 20 minutes, and then the PET film was peeled away to obtain a one-layered adhesive in the form of a film having a thickness of 25 μm. The glass transition temperature (Tg) of the obtained one-layered adhesive in the form of a film was measured by TMA (a product of Mac Science, TMA4000). As a result, it was 49° C.

In order to evaluate the heat resistance, the one-layered adhesive in the form of a film cut at 5 square-mm was inserted between a silicon chip at 5 square-mm and a silicon chip at 20 square-mm, which was heat-pressed at 200° C. under 0.1N load for 1 second and then heat-cured at 180° C. for 3 hours with no load. The obtained test piece was heated at 260° C. for 30 seconds to measure its shear strength using a shear tester. As a result, the shear strength was 6 MPa.

Furthermore, using the obtained one-layered adhesive in the form of a film as a reagent, the total amount of cyclic siloxane volatilizing therefrom was measured by gas chromatography under the following conditions. As a result, it was not more than the detection limit (≦1 ppm). The results are shown in Table 1.

<Conditions of Gas Chromatography>

Apparatus: 7694/6890GC System, a product of Hewlett Packard Co.

Separation column: HP-5MS, 30 m, 0.25 mmφ

Separation column oven temperature: 40° C. (for 3 min.) ->10° C./min temperature elevated ->300° C.

Measurement method: 0.5 g of a reagent was gathered and sealed in a 10-ml bias bottle, which was heated at 180° C. for 30 minutes. At that time, the volatilized portion was measured.

Example 2

An adhesive resin composition was prepared by mixing resins and an adhesive in the form of a film was obtained by using the adhesive resin composition in the same manner as in Example 1, except that the polyimide (P-2) solution obtained in Synthesis Example 2 was used. For the obtained adhesive in the form of a film, the adhesiveness and the heat resistance were evaluated, and the volatilized amount of cyclic siloxane was measured in the same manner as in Example 1. The results are shown in Table 1.

Example 3

The adhesiveness and the heat resistance were evaluated, and the volatilized amount of cyclic siloxane was measured in the same manner as in Example 1, except that the polyimide (P-3) solution obtained in Synthesis Example 3 was used. The results are shown in Table 1.

Comparative Example 1

The adhesiveness and the heat resistance were evaluated, and the volatilized amount of cyclic siloxane was measured in the same manner as in Example 1, except that the polyimide (P-4) solution obtained in Synthesis Example 4 was used. The results are shown in Table 1.

TABLE 1

|  | Example 1 | Example 2 | Example 3 | Comparative Example 1 |
| --- | --- | --- | --- | --- |
| Polyimide (Combination amount) | P-1 (100 weight parts) | P-2 (100 weight parts) | P-3 (100 weight parts) | P-4 (100 weight parts) |
| Epoxy compound (Combination amount) | VG3101 (20 weight parts) | VG3101 (20 weight parts) | VG3101 (20 weight parts) | VG3101 (20 weight parts) |
| Curing agent (Combination amount) | 2MAOK-PW (1 weight parts) | 2MAOK-PW (1 weight parts) | 2MAOK-PW (1 weight parts) | 2MAOK-PW (1 weight parts) |
| Filler (Combination amount) | 1-FX (40 weight parts) | 1-FX (40 weight parts) | 1-FX (40 weight parts) | 1-FX (40 weight parts) |
| Tg (° C.) | 49 | 48 | 54 | 52 |
| Heat shear strength (MPa) | 6 | 7 | 7 | 3 |
| Volatilized amount of cyclic siloxane (ppm) | <1 | <1 | <1 | 85 |

As described above, it was found that adhesive in the form of a film using the adhesive resin compositions prepared in Examples 1 to 3 had low glass transition temperatures, exhibiting excellent adhesiveness at a low temperature, and had high heat shear strengths, exhibiting superior heat resistance. Furthermore, 85 ppm of the cyclic siloxane was detected from the adhesive film in the form of a film using the resin composition comprising the polyimide obtained by using a diaminopolysiloxane as a raw material in Comparative Example 1, whereas no cyclic siloxane was detected from the adhesive in the form of a film in Examples 1 to 3.

INDUSTRIAL APPLICABILITY

When the adhesive resin composition of the present invention is used, it is possible to provide an adhesive in the form of a film having both excellent adhesiveness at a low temperature and superior heat resistance. Furthermore, without using a diaminopolysiloxane as a raw material, there is no volatilization of a cyclic siloxane that causes a problem in mounting. For that reason, a semiconductor device using the adhesive in the form of a film is superior in mounting reliability.

The invention claimed is:

1. An adhesive resin composition comprising:
a thermoplastic polyimide obtained by reacting a diamine component comprising a diamine represented by the following formula (1) with a tetracarboxylic acid dianhydride, and
a thermosetting resin contained in the ratio of from 1 to 200 weight parts, based on 100 weight parts of the thermoplastic polyimide,

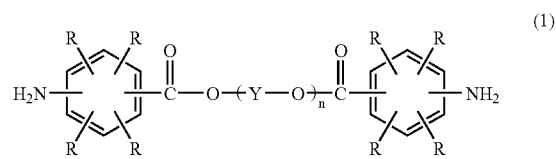

wherein, in the formula (1), Rs are each independently an atom or a group selected from the group consisting of a hydrogen atom, a halogen atom and a hydrocarbon group; n is a positive number of 1 to 50 on an average; Y represents an alkylene group having 2 to 10 carbons or an alkyl ether group having 2 to 10 carbons; and Ys may be the same or different when n is not less than 2.

2. The adhesive resin composition according to claim 1, wherein the diamine represented by the formula (1) is a diamine represented by the following formula (2),

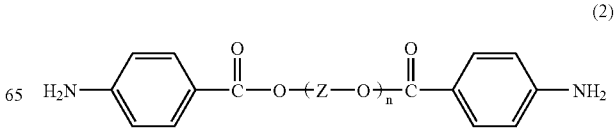

wherein, in the formula (2), n is an integer of 1 to 50 on an average; Z represents an alkylene group having 2 to 10 carbons; Zs may be the same or different when n is not less than 2.

3. An adhesive in the form of a film comprising the adhesive resin composition as claimed in claim 2.

4. A semiconductor device with semiconductor elements attached using the adhesive in the form of a film as claimed in claim 3.

5. The adhesive resin composition according to claim 1, wherein the diamine represented by the formula (1) is contained in the amount of not less than 20 mole % in the total diamine components.

6. An adhesive in the form of a film comprising the adhesive resin composition as claimed in claim 5.

7. A semiconductor device with semiconductor elements attached using the adhesive in the form of a film as claimed in claim 6.

8. An adhesive in the form of a film comprising the adhesive resin composition as claimed in claim 1.

9. A semiconductor device with semiconductor elements attached using the adhesive in the form of a film as claimed in claim 8.

* * * * *